United States Patent [19]

Balan et al.

[11] 4,316,134
[45] Feb. 16, 1982

[54] FAULT INDICATING CIRCUIT FOR AN AUTOMOTIVE ALTERNATOR BATTERY CHARGING SYSTEM

[75] Inventors: Isadore Balan, Schaumburg; Kirk A. Sievers, Roselle, both of Ill.

[73] Assignee: Motorola, Inc., Schaumburg, Ill.

[21] Appl. No.: 137,332

[22] Filed: Apr. 4, 1980

[51] Int. Cl.³ .............................................. H02J 7/14
[52] U.S. Cl. ..................................... 322/99; 320/48; 320/64
[58] Field of Search ..................... 322/28, 99; 320/64, 320/68, 48

[56] References Cited

U.S. PATENT DOCUMENTS

| | | | |
|---|---|---|---|
| 3,138,751 | 6/1964 | Brewster | 320/68 |
| 3,210,727 | 10/1965 | McLaughlin et al. | |
| 3,305,774 | 2/1967 | Heath | 322/99 X |
| 3,321,754 | 5/1967 | Grimm et al. | |
| 3,365,646 | 1/1968 | Brewster | 320/64 |
| 3,524,121 | 8/1970 | Nolan et al. | 320/48 |
| 3,612,982 | 10/1971 | Jones et al. | 322/28 |
| 3,668,504 | 6/1972 | Kawashima | 320/64 |
| 3,673,588 | 6/1972 | Riff . | |
| 3,942,097 | 3/1976 | Itoh et al. | 320/64 X |
| 3,944,905 | 3/1976 | Allport et al. | 322/99 X |
| 4,000,453 | 12/1976 | Scheldrake et al. | 320/64 X |
| 4,019,120 | 4/1977 | Fattic | 322/28 |
| 4,143,313 | 3/1979 | Arendt | 320/64 X |

FOREIGN PATENT DOCUMENTS 1493707 11/1977 United Kingdom .
1499175 1/1978 United Kingdom .

Primary Examiner—Robert J. Hickey
Attorney, Agent, or Firm—Phillip H. Melamed; James S. Pristelski; James W. Gillman

[57] ABSTRACT

A fault indicating circuit for an automobile alternator battery charging system is disclosed. The charging system comprises an alternator providing a rectified battery charging signal in response to alternator field coil excitation which is controlled by a voltage regulator that senses battery voltage. The fault indicating circuit comprises a low voltage detector circuit which provides constant DC excitation for an indicator lamp in response to low alternator output voltage and a high voltage detector circuit which provides intermittent excitation for the lamp in response to an excessively high alternator output voltage, the lamp being maintained in a de-energized state in response to the normal alternator output voltage.

12 Claims, 4 Drawing Figures

FAULT INDICATING CIRCUIT FOR AN AUTOMOTIVE ALTERNATOR BATTERY CHARGING SYSTEM

BACKGROUND OF THE INVENTION

The present invention relates generally to the field of indicating circuits for use in automotive alternator battery charging systems. More particularly, the present invention relates to indicating circuits which provide visual indications of the malfunctioning of an automotive alternator battery charging circuit whose output is controlled in response to sensed battery voltage by a voltage regulator.

Voltage regulator controlled automotive alternator battery charging systems are commonly used in automotive electrical systems to provide for keeping an automotive storage battery at a full charge level. These type of systems function by a voltage regulator controlling the field coil excitation of an alternator in response to sensed battery voltage wherein the output of the alternator is full wave rectified and utilized to maintain the charge on the storage battery. In such systems, an indicator lamp is typically used to provide an indication of 0 alternator output so as to alert the operator of the automobile to a malfunctioning of the battery charging system. In some of these systems, the DC current which is utilized to provide a low alternator output indication before rotation of the alternator rotor carrying the field coil has commenced is also utilized to supply the alternator field coil excitation. Examples of prior systems of this type are shown in U.S. Pat. No. 3,365,646 and 3,138,751, both of which are assigned to the same assignee as the present invention. In these prior systems, the use of the lamp excitation current to also supply the initial field coil excitation minimizes the number of electrical connections necessary for the battery charging system. However, typically these type of charging systems only provide a visual indication of alternator malfunction in response to a low alternator charging output signal.

Some prior art systems have recognized the need for providing a visual indication of an excessively high alternator output voltage which is therefore indicative of a malfunction of the alternator battery charging system. U.S. Pat. No. 3,673,588, assigned to the same assignee as the present invention, is an example of one of these systems in which separate sensing circuits are utilized to separately excite different lamps so as to indicate both high and low voltage conditions. In addition, some prior systems such as that shown in co-pending U.S. Patent Application Ser. No. 038,965, filed May 14, 1979, entitled "Alarm Circuit for Automobile Alternator" and assigned to the same assignee as the present invention, contemplate the use of a single lamp for providing a single visual display indicative of either low or high alternator voltage output conditions.

In the prior systems which utilize a plurality of indicating lights, this requires an additional indicator light be provided on the dashboard of the automobile and the provision of this additional lamp is generally considered to be undesirable for aesthetic reasons as well as since additional complex circuitry may have to be utilized for providing the proper excitation to the over voltage light as well as for providing a mechanism for testing the over voltage light to ensure that it is in operating order. Thus circuitry must exist to insure (test) that this light is not burned out, since typically the light would only come on during a high voltage failure mode.

The prior art systems which utilize a single light to indicate both low and high alternator outputs have the disadvantage in that the operator of the automobile has no indication if the alternator malfunction is caused by an excessive alternator output or a deficient alternator output. In the case of an excessive alternator output, prolonged operation of the charging system in this mode can readily result in damage to the battery and alternator due to over charging of the battery and the generation of extremely large alternator voltages. This is to be contrasted with prolonged operation of the alternator battery charging system when the alternator output is found to be deficient. In this latter mode, the only danger is that the battery will eventually discharge after prolonged usage. Thus, unles the operator of the automobile is aware of which type of alternator malfunction has occurred, he may unknowingly risk damage to the alternator and battery by attempting to continue to drive the automobile while the charging system has malfunctioned.

Some prior systems have illustrated separate plug in test modules in which high and low alternator output failure modes are indicated by a flashing test light, separate from the dashboard mounted lamp which supplies initial field excitation, while other failure modes are indicated by continuous illumination of the test light. These systems require disconnection of the dashboard lamp, and fail to differentiate between high and low output failures.

SUMMARY OF THE INVENTION

An object of the present invention is to provide an improved fault indicating circuit for an automobile alternator battery charging system which overcomes the aforementioned disadvantages.

A more particular object of the present invention is to provide an improved fault indicating circuit in which a single lamp, preferably mounted in the vehicle dashboard, is utilized to provide two different visual indications to differentiate between low and high alternator voltage output malfunctions.

A still further object of the present invention is to produce such a fault indicating circuit which employs a minimum of additional circuitry and is readily compatible with existing alternators and voltage regulators, and which utilizes the dashboard indicating lamp to provide failure mode indications and to provide initial field coil excitation.

In one embodiment of the present invention, an improved fault indicating circuit for an automotive alternator battery charging system is provided. The fault indicating circuit comprises: low voltage detector means for illuminating a display device to provide one visual indication in response to a sensed alternator output signal, related to a recitified alternator output charging signal, having a magnitude below a first predetermined reference voltage magnitude, and high voltage detector means for illuminating said display device to provide a different visual indication in response to said sensed alternator output signal having a magnitude above a second predetermined reference voltage magnitude larger than said first predetermined reference voltage magnitude, said display device being non-illuminated when said sensed alternator output charging signal has a magnitude between said first and second magnitudes, whereby the fault indicating circuit utilizes a single display device to provide different visual indications representative of different failure modes of an alternator battery charging system.

Preferably, the display device comprises a lamp which is constantly energized to provide a continuous visual illumination indication representative of either the low or high charging voltage failure mode of the alternator, while the lamp receives periodic pulsating excitation to provide a flickering visual illumination indication indicative of the other failure mode of the alternator charging system, the lamp being de-energized for the normal alternator mode of operation. Also, preferably, both the low voltage detector means and high voltage detector means are responsive to the same signal which is indicative of the magnitude of the rectified alternator charging output signal, and this same signal is provided by auxiliary alternator rectifiers which provide a rectified, isolated auxiliary alternator output signal having a magnitude related to the magnitude of the rectified alternator battery charging signal. In addition, preferably, the lamp energized by the low and high voltage detector means provides a DC current excitation path for initial field coil current before the alternator rotor has started to turn, this initial field coil current therefore always resulting in the initial excitation of the lamp for a condition of 0 alternator output.

Two additional features of the present invention are (1) that it provides a positive visual indication of the breaking of the voltage regulator battery sensing connection, and (2) that it provides a positive visual indication of low alternator output when the alternator field coil is open and the indicator lamp is used to serially supply the initial field coil excitation,. All failure modes are preferably indicated by a dashboard mounted lamp which is used to supply initial field coil excitation to the alternator.

BRIEF DESCRIPTION OF THE DRAWINGS

For a more complete understanding of the present invention reference should be made to the drawings, in which.

DESCRIPTION OF THE PREFERRED EMBODIMENT

Figure 1:
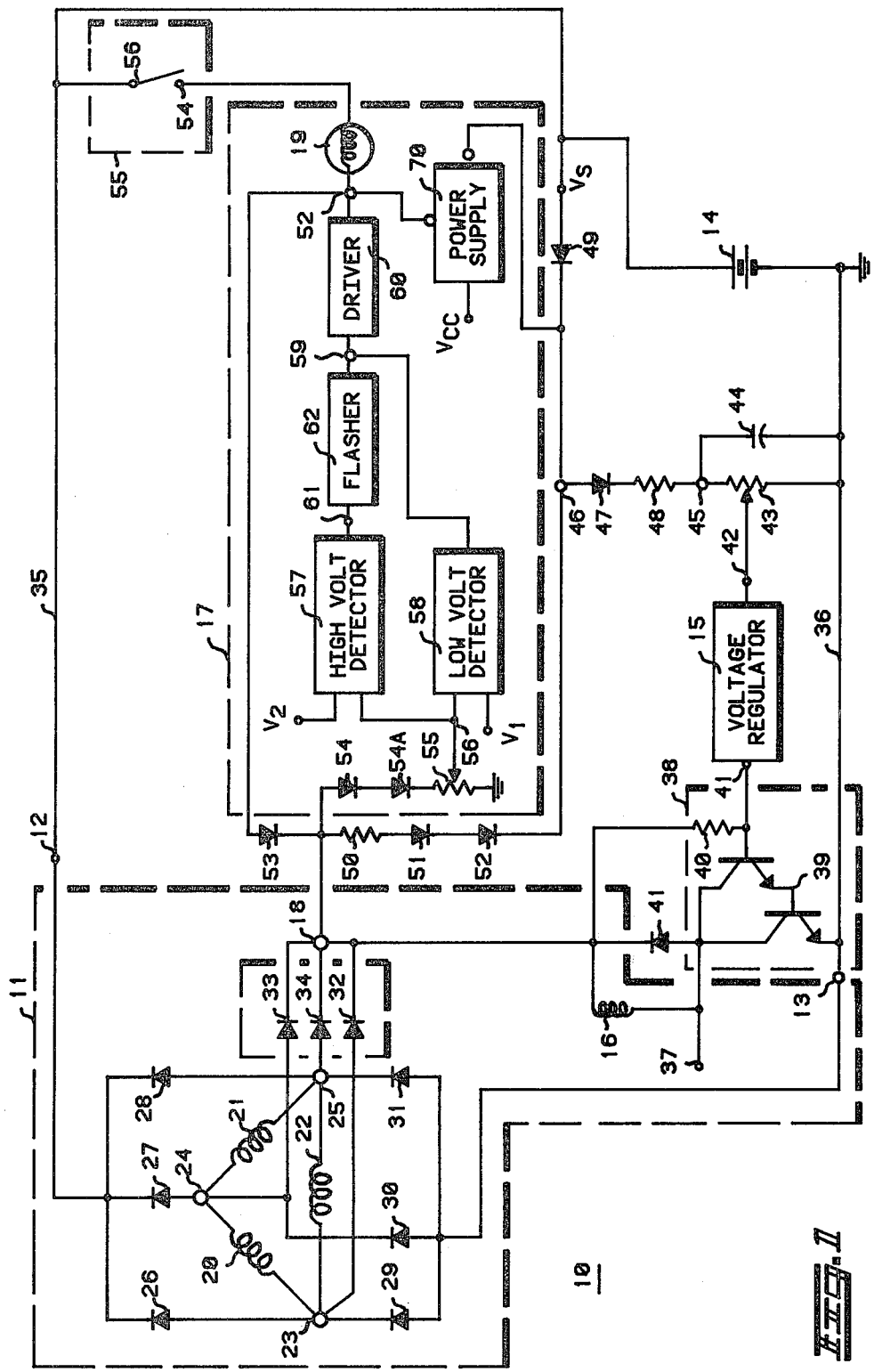
FIG. 1 is a combination block and schematic diagram of an automotive alternator battery charging system.

Referring to FIG. 1, an automotive alternator battery charging system 10 is illustrated. Basically, the charging system 10 comprises an alternator 11 (shown dashed) which provides positive and negative rectified battery charging output voltages at terminals 12 and 13, respectively, that are directly connected to the positive and negative terminals of a storage battery 14 wherein the negative terminal of the battery is grounded. The output of the alternator 11 is essentially controlled by a voltage regulator 15 which effectively monitors the positive battery voltage at a terminal $V_S$ and provides, in accordance with the monitored voltage, conrol excitation to a rotatable field coil 16 of the alternator 11. A fault indicator circuit 17 is responsive to an auxiliary rectified output of the alternator 11 provided at a terminal 18 and provides various falt indicating excitations for a falt indicator lamp 19. Preferably the lamp 19 is mounted in the dashboard of a vehicle carrying the alternator charging system 10. The preceding statements generally indicate the functioning of the charging system 10, and the details of this system will now be discussed.

The alternator 11 comprises three stationary output windings 20, 21, and 22 arranged in a delta configuration having nodes 23 through 25. Each of the nodes 23 through 25 is coupled to one anode and one cathode of main alternator output positive and negative rectifying diodes 26 through 28 and 29 through 31, respectively. The cathodes of positive rectifying diodes 26 through 28 are directly connected together and connected to positive output alternator terminal 12, while the anodes of negative rectifying diodes 29 through 31 are connected together and directly connected to negative alternator output terminal 13 which is grounded. The alternator 11 also comprises the rotatable alternator field excitation coil 16 which is contemplated as being rotated by an automobile internal combustion engine drive shaft. In addition the alternator 11 includes three auxiliary output rectifying diodes 32 through 34 which have their anodes coupled to terminals 23 through 25, respectively, and have their cathodes connected together at terminal 18 to provide a rectified auxiliary positive alternator output at this terminal. The rectified auxiliary output of the terminal 18 is directly related to the rectified charging output at the terminal 12, but is isolated electrically therefrom. Preferably, all of the components recited above and shown within the dashed lines of the alternator 11 are mounted on or within the physical housing of the alternator 11.

Essentially, the alternator operates by receiving an excitation signal in its field coil 16 which results in inducing AC output signals in the windings 20 through 22 due to the existence of the alternator magnetic field and due to relative movement between the field created by the field coil 16 and the output windings 20 through 22. Preferably, the field coil 16 is rotated by a drive shaft of an automobile engine while the output windings 20-23 remain stationary. This type of construction is well known and will therefore not be discussed further.

The positive rectified output of the alternator 11 is provided at the terminal 12 and is coupled to the positive terminal of the battery 14 by a cable 35. Similarly, the negative rectified output of the alternator 11 provided at the terminal 13 is coupled by a cable 36 to ground and to the negative terminal of the battery 14. The alternator field coil 16 is connected between the terminal 18 and a test terminal 37 which corresponds to the output terminal of a driver stage 38 shown dashed in FIG. 1. The driver stage 38 comprises a Darlington NPN transistor configuration 39 having its output collector corresponding to the terminal 37, its output emitter connected to ground and its input base terminal connected to the terminal 18 through a resistor 40. A flyback diode 41 is connected in parallel with the field coil 16 with its anode directly connected to the terminal 37 and its cathode connected to the terminal 18. Essentially, the flyback diode prevents large reverse spikes from occurring across the field coil 16 during the cutoff of field coil excitation, and the Darlington device 39 acts as a switching device to control the field coil excitation since the Darlington device is in series with the field coil current.

The voltage regulator 15 provides an output control voltage at a terminal 41 which is directly connected to the base of the Darlington device 39. In this manner the voltage regulator 15 controls the field excitation of the alternator and therefore controls the output of the alternator 11 since the alternator output is directly related to its field coil excitation when relative movement exists between the field coil 16 and the output windings 20 through 22.

The voltage regulator 15 has an input terminal 42 which is directly connected to the center tap of a potentiometer 43 which has a capacitor 44 coupled in parallel with the resistive element of the potentiometer between a terminal 45 and ground. The terminal 45 is coupled to a terminal 46 through the series connection of a diode 47 and a resistor 48 with the anode of the diode 47 directly connected to the terminal 46. The terminal 46 is connected to a voltage sensing terminal $V_S$ through a diode 49 having its anode directly connected to the terminal $V_S$, and the terminal $V_S$ is directly connected to the positive terminal of the battery 14. The preceding structure illustrates how the battery 14 provides a positive voltage at the terminal $V_S$ related to battery voltage which results in providing an adjustable, preset potential at the terminal 42 related to battery voltage which is utilized by the voltage regulator 15 to provide a control voltage at the terminal 41 that determines the field coil excitation for the alternator battery charging system. The components 43, 44, and 48 essentially form a ripple filter which minimizes variations of the input voltage provided at the terminal 42.

The actual configuration for the voltage regulator 15 can be any type of suitable voltage regulator device and many such regulators are known some of which are illustrated in U.S. Pat. Nos. 3,365,646, 3,138,751, and 3,673,588, all of which are assigned to the assignee of the present invention. The basic function of the regulator 15 is to control the field coil excitation such that a closed loop feedback control system is implemented wherein the field excitation is adjusted to maintain the voltage at the terminal 42 substantially constant. By adjusting the position of the center tap of the potentiometer 43, this will result in having the alternator 11 charge the battery 14 so as to effectively maintain a predetermined constant potential at the terminal $V_S$ and therefore at the positive battery terminal, in accordance with the setting of the potentiometer 43.

The terminal 46 is also coupled to the terminal 18, at which the positive rectified alternator output voltage from the auxiliary diodes 32 through 34 is produced, by the series connection of a resistor 50 and two series connected identically poled diodes 51 and 52 with the anode of diode 51 directly connected to the resistor 50 and the cathode of the diode 52 directly connected to the terminal 46. The terminal 18 is also coupled to a terminal 52 through a diode 53 having its anode directly connected to the terminal 52. The terminal 52 is connected through the lamp 19 to a terminal 54 of an ignition switch 55 (shown dashed) which has another terminal 56 directly connected to the positive terminal of the battery 14.

The above-recited connections allow the charging system 10 to function as follows. When the ignition switch 55 is closed during initial startup of the automobile engine before any substantial output is produced by the alternator 11, field coil excitation is provided by the series current which passes through the lamp 19, the diode 53 and the field coil 16. This is because the positive battery voltage passed through the lamp 19 will forward bias the diode 53 and supply a positive voltage at the terminal 18 that results in turning on the Darlington device 19, by virtue of the bias applied to the base of this device through the resistor 40, and this results in providing field current to the field coil 16. The voltage regulator 15 allows the turning on of the Darlington device 39 since, during start up, the battery voltage falls below the voltage level at which the regulator 15 and potentiometer 43 are set to maintain. After the alternator has started rotating, the auxiliary diodes 32 through 34 provide an auxiliary rectified positive voltage at the terminal 18, and this voltage now provides the field coil excitation current and at the same time prevents the forward biasing of the diode 53 and thereby normally extinguishes the lamp 19 since other circuits connected to the terminal 52 are intended to normally have high input impedances and therefore draw an insignificant amount of current such that the lamp 19 will not light.

The components 50 through 52 provide a voltage sense protection circuit for the present invention. In some prior art systems, if the connection betwen the voltage sensing terminal $V_S$ and the battery is disconnected, this will result in creating an extremely low voltage, or 0 voltage, at the regulator input terminal corresponding to the terminal 42. The voltage regulator would then misinterpret this as an extremely low battery voltage and provide maximum field coil excitation resulting in damage to the battery due to overcharging. This is prevented in the present charging system 10 by the components 50 through 52 providing terminal 46 with an alternative path by which the terminal 46 is connected to a positive voltage source which this time comprises the voltage at the terminal 18.

During the normal operation of the alternator 11, the voltage at the terminal 18 is equal to the voltage at the terminal 12 which is substantially identical to the positive battery terminal voltage. During this condition, the voltage at the terminal 46 is one diode drop below the positive battery terminal voltage and this ensures the non-conduction of current by the components 50 through 52. However, if the terminal $V_S$ is disconnected from the positive battery terminal, then the components 50 through 52 conduct and the voltage at the terminal 46 will be more than two diode drops below the voltage at the terminal 18. In the closed loop alternator charging system 10, the voltage regulator 15 controls field excitation such that the voltages at the terminals 42, 45, and 46 are all maintained at substantially constant values. This means that if the voltage terminal $V_S$ is disconnected from the positive battery terminal, the regulator 15 will maintain the same voltage at the terminal 46 and this will result in raising the voltage at the terminal 18, not to an uncontrolled high voltage, but to a slightly higher voltage determined by one additional diode drop and the series voltage drop across the resistor 50. This ensures that excessively large battery charging voltages are not produced across the terminals 12 and 13 due to the disconnection of the terminal $V_S$ from the positive battery terminal, and that only a moderate increase in the charging voltage is provided in such a case. This feature has been provided in some prior art charging systems, and is especially significant in conjunction with the fault indicating circuit 17 as will be discussed subsequently.

The fault indicating circuit 17 includes two identically poled series connected diodes 54 and 54A connected with the anode of diode 54 directly connected to terminal 18 and the cathode of diode 54A coupled to ground through the resistive element of a potentiometer 55. The center tap of the potentiometer 55 is coupled to an input terminal 56 which supplies a sensing signal to both a high voltage detector circuit 57 and a low voltage detector curcuit 58. The signal at the terminal 56 is directly related to the recitified auxiliary positive voltage provided at the terminal 18 which should normally be substantially indentical to the rectified alternator output charging signal provided at the terminal 12.

The low voltage detector circuit 58 also receives a first predetermined reference voltage at a terminal $V_1$ and effectively compares this voltage with the voltage at the terminal 56 and provides an output which is coupled to a control terminal 59 of a driver stage 60 that produces a corresponding output that is coupled to the terminal 52. The high voltage detector circuit 57 receives a second predetermined reference voltage at a terminal $V_2$ which is higher than the first predetermined voltage provided at the terminal $V_1$. The high voltage detector circuit 57 effectively compares the voltage at the terminal $V_2$ with the voltage at the terminal 56 and provides an output at a terminal 61 that is coupled as an input to a flasher circuit 62 that provides a corresponding output to the terminal 59.

Essentially, the low voltage detector circuit 58 provides a high drive signal output to the terminal 59 in response to the voltage at the terminal 56 being below the voltage at the terminal $V_1$. This results in the driver stage 60 providing a relatively low impedance connection to ground at the terminal 52 which in turn results in energizing the lamp 19 and keeping this lamp energized as long as this low voltage condition for the voltage at the terminal 56 exists. The driver stage 60, when energized by the low voltage detector circuit 58 will still permit the lamp 19 to supply field coil excitation to the coil 16, even though some lamp current will pass through resistor 64. When the voltage at terminal 56 is above $V_1$, the low voltage detector circuit 58 does not provide a high output signal at terminal 59.

The high voltage detector circuit 57 receives the voltage at the terminal 56 and compares it with the voltage at the terminal $V_2$. Whenever the voltage at the terminal 56 is greater than the voltage at the terminal $V_2$, the high voltage detector circuit 57 provides a high voltage output at the terminal 61 which is an input to the flasher circuit 62 that essentially comprises a known flasher circuit such as a 555 flasher made by Motorola, Inc. Such flashers, upon the application of a high voltage control signal produce a periodic high and low voltage output at a presettable rate, whereas in response to a low voltage input, the flasher produces a constant low voltage output. Thus, if the high voltage detector circuit 57 determines that the voltage at the terminal 56 is greater than the reference voltage provided at the terminal $V_2$, then the voltage at the terminal 59 will be an AC signal, at a low frequency of 4 Hertz for example, and this will result in the intermittent or flashing excitation of the lamp 19 by the driver 60.

If the voltage at the terminal 56 is greater than the voltage at the terminal $V_1$, but less than the voltge at the terminal $V_2$, then neither the low voltage detector 58 nor the high voltage detector 57 will result in providing a signal at the terminal 52 to cause the lamp 19 to be turned on, and the lamp will be de-energized (non-illuminated).

Thus, the fault-indicating circuit 17 has provided circuitry which utilizes the same indicator lamp 19 to indicate a low voltage alternator output by providing constant excitation to the indicator lamp 19 to provide one visual indication while indicating an over-voltage condition for the alternator output by utilizing the lamp 19 to provide a different visual indication comprising the intermittent excitation of the lamp 19, wherein the lamp 19 is contemplated as being de-energized for the normal alternator output voltage being provided at the terminal 18 since this output will result in a voltage at the terminal 56 which is between the voltages at the terminals $V_1$ and $V_2$.

It should be noted that in the case of the disconnection of the voltage sensing terminal $V_S$ from the positive battery terminal, it is contemplated that the voltage at the terminal 18 will rise due to the action of the components 50 and 52 such that the voltage at the terminal 56 will now exceed the voltage at the terminal $V_2$ and an indication of over-voltage will be provided by the flashing of the lamp 19. This creates a visual warning indication between the breaking of the connection between the positive battery terminal and the terminal $V_S$, while still regulating the alternator output to a safe but higher than normal level.

By the above-recited structure, it is apparent that the present invention has provided for the use of a single indicator lamp 19 wherein separate alternator voltage detecting circuits are utilized to provide different modes of excitation for the indicator lamp 19 so as to provide different visual indications wherein one visual indication indicates the existance of a larger than normal alternator output charging voltage, and the other visual indication indicates the existence of a lower than normal alternator output charging voltage. As was previously noted, an excessively high alternator output charging voltage can result in permanent damage to the battery and alternator. This can occur because of the shorting of the Darlington device 39. As was also previously noted, breaking the connection between the terminal $V_S$ and the positive battery terminal will also result in a higher than normal alternator output voltage and produce a flashing of the light 19. In addition, a break in the connection line 35 can also result in an excessively high alternator output voltage since the voltage provided at the terminal 12 will now not be limited to the battery voltage because of the open circuit connection between the terminal 12 and the positive battery terminal. All of these modes of over-voltage malfunction of the alternator are designated by a flashing illumination of the lamp 19.

The fault indicator circuit 17 indicates a low voltage malfunction prior to the rotation of the alternator due to the lamp 19 passing series field coil current through the diode 53. Upon the existence of some alternator output at the terminal 18, the terminal 18 will supply the field coil current primarily, but the low voltage detector 58 can still determine when the voltage at the terminal 18 is below a predetermined minimum value so as to cause excitation of the lamp 19 in a constant manner as opposed to the flashing high voltage indication provided by the detector circuit 57.

Figure 2:
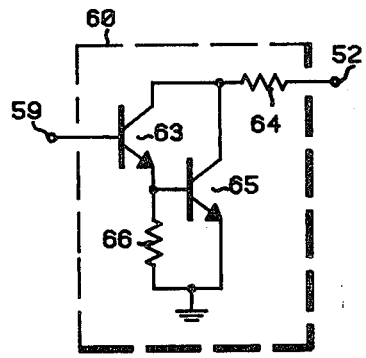
FIG. 2 is a detailed schematic of a driver stage in the charging system shown in FIG. 1.

FIG. 2 illustrates a typical embodiment for the driver circuit 60 shown in FIG. 1. In FIG. 2, as well as FIGS. 3 and 4, identically corresponding components have been identically numbered. In FIG. 2, terminal 59 is connected to the base of an NPN transistor 63 having its collector connected through a resistor 64 to the terminal 52 and its emitter directly connectd to the base of an NPN transistor 65 and connected to ground through a resistor 66. Transistor 65 has its emitter directly connected to ground and its collector directly connected to the collector of transistor 63. This configuration of the driver stage 60 implements a relatively low impedance at the terminal 52, as represented by the resistor 64, in the event of a positive drive signal at the terminal 59. In the absence of a positive drive signal at the terminal 59, the transistors 63 and 65 are off and the circuit does not resistively load down the terminal 52.

Figure 3:
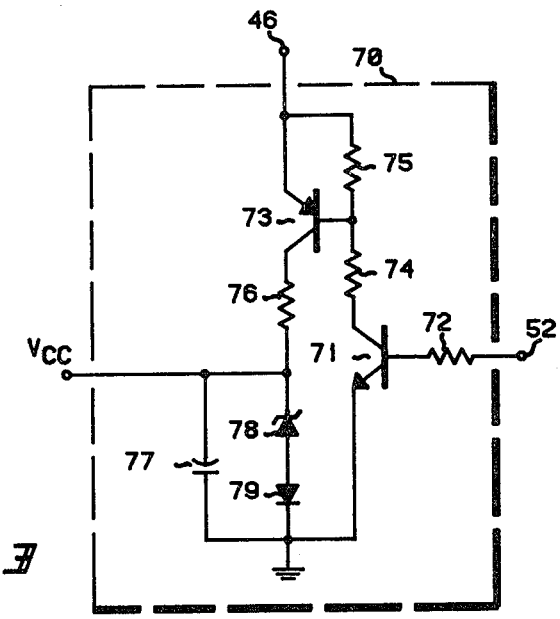
FIG. 3 is a detailed schematic of a power supply circuit shown in the charging system in FIG. 1.

FIG. 3 illustrates a configuration for a power supply circuit 70 which is contemplated as being contained in the fault indicating circuit 17. The power supply circuit comprises an NPN transistor 71 which has its base coupled through a resistor 72 to the terminal 52. Transistor 71 has its emitter directly connected to ground and its collector connected to the base of a PNP transistor 73 through a resistor 74. Transistor 73 has its emitter directly connected to the terminal 46, its base coupled through a resistor 75 to the terminal 46 and its collector connected through a resistor 76 to a terminal $V_{CC}$ which is coupled to ground through a capacitor 77. The terminal $V_{CC}$ is coupled to the cathode of a Zener diode 78 which has its anode coupled to the anode of a diode 79 that has its cathode directly connected to ground.

The function of the power supply 70 is essentially to provide a regulated voltage at the terminal $V_{CC}$ determined primarily by the magnitude of the breakdown voltage of Zener diode 78 in response to closing of the ignition switch 55 which will provide a positive voltage at the terminal 52. This is accomplished by the positive voltage at terminal 52 turning on the transistor 71 and resulting in the voltage at the terminal 46 being passed through the resistor 76 to the Zener diode 78. It is contemplated that the voltage $V_{CC}$ is approximately six volts whereas the terminal 46 will typically be over ten volts since it is only one diode drop below the battery voltage under normal operating conditions and normal battery voltage exceeds ten volts. It should be noted that the power supply circuit does not load down the terminal 52 since its connection to this terminal is through the base circuit of the transistor 71. The function of the power supply circuit 70 is to provide the stable reference voltage $V_{CC}$ which is utilized by the low and high voltage detector circuits 57 and 58.

Figure 4:
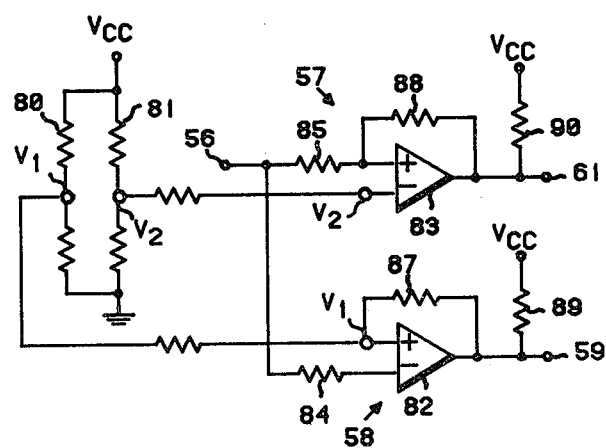
FIG. 4 is a detailed schematic diagram of high and low voltage detector circuits illustrated in the charging system in FIG. 1.

FIG. 4 illustrates a typical embodiment for the high voltage detector circuit 57 and the low voltage detector circuit 58. Resistor dividers 80 and 81 are coupled between the regulated voltage $V_{CC}$ and ground to provide the reference voltages $V_{CC}$ and $V_{CC}$, respectively, at the divider midpoints, as inputs to voltage comparators 82 and 83 which receive other voltage inputs by virtue of resistors 84 and 85 that are coupled between the terminal 56 and the comparators 82 and 83, respectively. Input to output connected feedback resistors 87 and 88 are provided for the comparators 82 and 83, respectively, such that the comparators 82 and 83 will have a slight amount of hysteresis for their switching thresholds so as to prevent false switching due to noise impulses. The outputs of the comparators 82 and 83 are coupled through resistors 89 and 90, respectively, to the terminal $V_{CC}$, and are coupled to the terminals 59 and 61, respectively.

With regard to the charging system 10, the following system operations are considered significant.

It should be noted that the present invention provides for a detection of an open field current circuit by providing a continuous excitation signal for the lamp 19. Prior fault indicating circuits did not generally provide such an indication because if the field current circuit was open energizing current could not pass through the lamp 19. However, the present fault indicating circuit 17 utilizes the low voltage detector 58 to ensure that the lamp 19 is excited for no alternator output being provided at the terminal 18 when this is due to an open field current circuit. This occurs even though current through the lamp 19 is utilized to provide the initial field coil excitation current.

The present invention also provides for detecting the shorting of the Darlington device 39, the opening of the cable 35, or the breaking of the connection between the terminal $V_S$ and the positive battery terminal, and all these faults are indicated by a flashing of the lamp 19 since these faults result in increasing the rectified alternator output voltage at the terminal 18 above a predetermined maximum vlaue. In addition, the present fault indicating circuit 17 will provide a low voltage indication when the alternator output capacity is diminished to such an extent that it cannot sustain voltages between the terminals 12 and 13 to prevent typical low resistance loads across the battery 14 from lowering the battery voltage below a desired minimum level.

An additional advantage of the present invention is that it allows determination of whether the alternator, the regulator, or the connections between these elements in the battery are defective. Thus, the present invention serves a diagnostic function for repairing a defective charging system and this is accomplished in the following manner.

If the lamp 19 flashes, this can be due to the opening of the connection line 35 or the opening of the connection between the terminal $V_S$ and the positive battery terminal. Thus by making sure that the cable connection 35 and the connection between the terminal $V_S$ and the positive battery terminal are proper, a repairman for the charging system can be sure that if the lamp 19 still flashes, then the malfunction of the charging system is due to a shorted output in the regulator 15 or driver stage 38 resulting in continuously providing field coil excitation to the alternator resulting in an excessively high alternator output at the terminals 12 and 18. This indicates that replacing the voltage regulator module, which would typically include the driver stage 38 as well as the regulator 15 and components 43–48, is required.

If low alternator output voltage has been indicated by the lamp 19, the repair procedure is to ground the terminal 37 to determine if the alternator or regulator is at fault. If the grounding of the terminal 37 will initially extinguish the lamp and then the lamp begins to flash, this indicates that the regulator containing the voltage regulator 15 and drive circuit 38 is faulty since the repair procedure has now ensured that excessive field coil excitation current will be drawn by shorting the terminal 37 to ground. If shorting the terminal 37 to ground does not extinguish the lamp 19, this indicates a defective alternator in that either the alternator field coil is open or other alternator problems such as open or shorted rectifying diodes or stator windings exist. This would then indicate that replacement of the alternator, which preferably includes all of the elements within the box 11, would be warranted.

It is contemplated that the regulator, as a chassis separate from the alternator, would include at least the voltage regulator 15, the components 43–48, and drive circuit 38, and could also include the basic electronics of the fault indicating circuit 17. Thus when a regulator defect is detected this circuitry in its entirety would be replaced after ensuring that improper cable connections have not caused the charging system fault and when the fault does not lie within the alternator chassis.

While we have shown and described specific embodiments of this invention, further modifications and improvements will occur to those skilled in the art. All such modifications which retain the basic underlying principles disclosed and claimed herein are within the scope of this invention. One such modification is to add another flasher between the low voltage detector and terminal 59 to indicate low voltage by flashing the lamp at a different rate than the flasher 62.

We claim:

1. A fault indicating circuit for an automotive alternator battery charging system, comprising:
   low voltage detector means for illuminating a display device to provide one visual indication in response to a sensed alternator output signal, related to a rectified alternator output charging signal, having a magnitude below a first predetermined reference voltage magnitude; and
   high voltage detector means for illuminating said display device to provide a different visual indication in response to said sensed alternator output signal having a magnitude above a second predetermined reference voltage magnitude greater than said first predetermined reference voltage magnitude, said display device being non-illuminated when said sensed alternator output signal is between said first and second reference voltage magnitudes, whereby said fault indicating circuit utilizes a single display device to provide different distinct visual indications indicative of high and low alternator output modes of failure for an alternator battery charging system,
   wherein said display device comprises a lamp, and
   wherein said circuit includes circuitry for serially coupling said lamp and a field coil of said alternator such that said lamp supplies initial excitation current for said field coil when said alternator output charging signal and said sensed alternator output signal are substantially zero.

2. A fault indicating circuit according to claim 1 wherein one of said first and second visual indications for said display device comprises apparent continuous illumination of said display device wherein the other of said visual indications comprises apparent pulsating illumination of said display device.

3. A fault indicating circuit according to claim 2 wherein said display device comprises a lamp.

4. A fault indicating circuit according to claim 3 wherein said pulsating illumination occurs at a predetermined periodic rate.

5. A fault indicating circuit according to claim 3 wherein said low voltage detector means provides a constant energization signal for energizing said lamp in response to said sensed alternator signal being below said first reference voltage magnitude, and wherein said high voltage detector means provides a periodic energization signal for pulsating energization of said lamp in response to said sensed alternator signal being above said second reference voltage magnitude to provide said apparent pulsating illumination.

6. A fault indicating circuit according to claims 1, 2, 3, 4, or 5, wherein said low and high voltage detector means are both coupled to said sensed signal related to said rectified alternator output charging signal, and wherein said sensed signal is provided by diode means which provide an auxiliary rectified alternator output corresponding in magnitude to said rectified alternator output charging signal, wherein said auxiliary alternator output is isolated from said rectified alternator output charging signal.

7. A fault indicating circuit according to claim 6 wherein said diode means comprises a plurality of diodes for rectifying the output of a plurality of alternator output windings.

8. A fault indicating circuit according to claim 1 wherein said circuit includes circuitry for providing excitation for said field coil from a rectified output of said alternator when said alternator output charging signal and said sensed alternator output signal are above zero.

9. A fault indicating circuit according to claim 8 wherein said low and high voltge detector means are both coupled to said sensed signal, wherein said sensed signal is provided by diode means which provide an auxiliary rectified alternator output corresponding in magnitude to said rectified alternator output charging signal, and wherein said auxiliary output is isolated from said rectified alternator output charging signal and supplies excitation for said field coil when said alternator output charging signal and said sensed alternator output signal are above zero.

10. A fault indicating circuit according to claim 9 wherein said lamp is mounted in the dashboard of an automobile and is illuminated in response to the lamp passing said initial field coil excitation current therethrough.

11. An alternator battery charging system with fault indicating circuit, comprising:
    a battery;
    alterntor means coupled to the battery for providing a rectified battery chargin signal in accordance with a control signal controlling excitation to an alternator field coil, said field coil normally receiving initial excitation current from said battery when the alternator output is low and subsequently receiving excitation current from an auxiliary rectified output of said alternator instead of said battery;
    voltage regulator means coupled to said battery and said alternator means for monitoring battery voltage and providing said alternator voltage field coil excitation control signal to maintain said battery voltage at a first voltage level; and
    fault indicator circuit comprising a lamp coupled in series with said field coil across said battery wherein said initial battery supplied field coil excitation causes illumination of said lamp by passing field current through the lamp, and wherein said fault indicator circuit includes a low voltage detector circuit for illuminating said light in response to a rectified alternator output being below a predetermined level, even if the alternator field coil is open circuited and draws substantially zero current, whereby an indication of low alternator output is provided even if the field coil is open circuited and thereby prevents the drawing of field current through the lamp.

12. An alternator battery charging system according to claim 11 wherein said auxiliary rectified alternator output is isolated from said alternator battery charging signal.

* * * * *